United States Patent
Lee et al.

(10) Patent No.: US 8,217,728 B2
(45) Date of Patent: Jul. 10, 2012

(54) LC VOLTAGE-CONTROLLED OSCILLATOR

(75) Inventors: Hui Dong Lee, Daejeon (KR); Kwi Dong Kim, Daejeon (KR); Jong Kee Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 26 days.

(21) Appl. No.: 12/878,697

(22) Filed: Sep. 9, 2010

(65) Prior Publication Data

US 2011/0148534 A1   Jun. 23, 2011

(30) Foreign Application Priority Data

Dec. 21, 2009  (KR) .................. 10-2009-0128367
Mar. 29, 2010  (KR) .................. 10-2010-0027689

(51) Int. Cl.
*H03B 5/12* (2006.01)
*H03C 3/22* (2006.01)

(52) U.S. Cl. ............... 331/117 FE; 331/177 V; 331/185

(58) Field of Classification Search ................ 331/36 C, 331/117 FE, 117 R, 167, 177 V, 185
See application file for complete search history.

(56) References Cited

U.S. PATENT DOCUMENTS

| | | | |
|---|---|---|---|
| 6,114,919 A | | 9/2000 | Ajjikuttira et al. |
| 6,137,372 A * | | 10/2000 | Welland ..................... 331/117 R |
| 6,150,893 A * | | 11/2000 | Fattaruso .................. 331/117 R |
| 6,469,586 B1 * | | 10/2002 | Rogers et al. ............. 331/117 R |
| 6,731,182 B2 * | | 5/2004 | Sakurai ...................... 331/177 V |
| 6,750,726 B1 * | | 6/2004 | Hung et al. .................... 331/100 |
| 6,842,081 B2 * | | 1/2005 | Wang et al. ............... 331/117 R |
| 7,884,680 B2 * | | 2/2011 | Raidl et al. ..................... 331/167 |
| 8,031,020 B1 * | | 10/2011 | Tu et al. .................. 331/117 FE |
| 2011/0018646 A1 * | | 1/2011 | Lee et al. ................. 331/117 FE |

FOREIGN PATENT DOCUMENTS

| | | |
|---|---|---|
| JP | 11-163687 A | 6/1999 |
| KR | 1020050006772 A | 1/2005 |
| KR | 1020090090123 A | 8/2009 |

OTHER PUBLICATIONS

Dongmin Park et al., "An Adaptive Body-Biased VCO with Voltage-Boosted Switched Tuning in 0.5-V Supply", 2006, pp. 444-447, IEEE.

Axel D. Berny et al., "A 1.8-GHz *LC* VCO With 1.3-GHz Tuning Range and Digital Amplitude Calibration", IEEE Journal of Solid-State Circuits, Apr. 2005, pp. 909-917, vol. 40, No. 4, IEEE.

* cited by examiner

*Primary Examiner* — Levi Gannon

(57) ABSTRACT

An LC voltage-controlled oscillator (VCO) is provided. The LC VCO includes an LC resonant circuit including at least one inductor whose both terminals are connected to output nodes and at least one capacitor connected in parallel with the inductor, and an amplifier circuit including at least one pair of switching transistors. Here, drains of the pair of switching transistors are connected to the output nodes respectively, and gates of the switching transistors are connected with the drains through a variable capacitance block exhibiting different characteristics according to an input signal.

9 Claims, 9 Drawing Sheets

LC VOLTAGE-CONTROLLED OSCILLATOR

CROSS-REFERENCE TO RELATED APPLICATION

This application claims priority to and the benefit of Korean Patent Application No. 10-2009-0128367, filed Dec. 21, 2009 and Korean Patent Application No. 10-2010-0027689, filed Mar. 29, 2010, the disclosure of which is incorporated herein by reference in its entirety.

BACKGROUND

1. Field of the Invention

The present invention relates to an LC voltage-controlled oscillator (VCO), and more particularly to an LC VCO capable of relaxing restrictions on a power supply voltage level required for oscillation and oscillating without a varactor device.

2. Discussion of Related Art

A VCO is a circuit whose oscillation signal can vary in frequency according to a voltage applied from the outside, and is used as an important component in a wireless transceiver.

Among VCOs, an LC-type VCO uses negative resistance according to a positive feedback of a circuit. The oscillation signal of such an oscillator can be controlled by controlling a capacitance value of a varactor device present in the circuit using a control signal.

As an LC-type VCO, a negative conductance LC oscillator using a negative resistance characteristic based on a positive feedback of a transistor is widely known.

Figure 1:
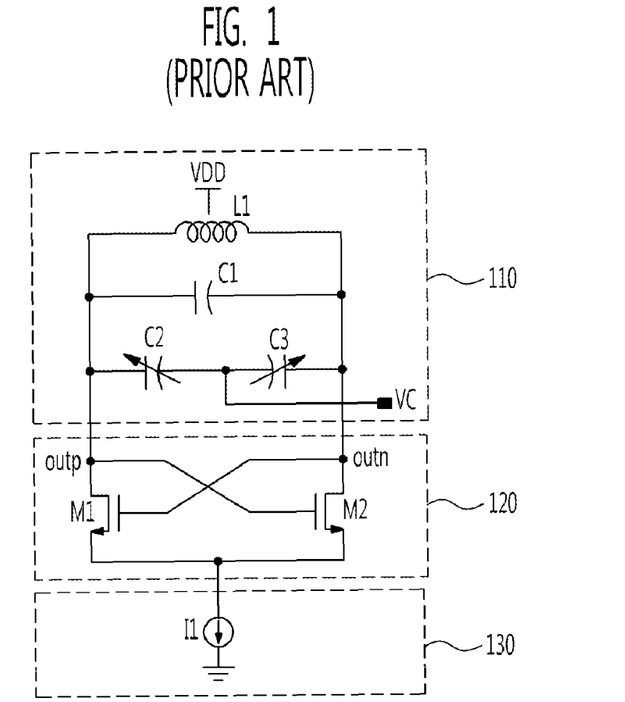
FIGS. 1 and 2 are circuit diagrams of conventional LC voltage-controlled oscillators (VCOs)

FIG. 1 is a circuit diagram of a general LC VCO.

As shown in FIG. 1, a general LC VCO includes an LC resonant circuit 110 including at least one inductor $L_1$, a capacitor $C_5$ connected in parallel with the inductor $L_1$, and variable capacitors $C_2$ and $C_3$ included in at least one varactor device, and an amplifier circuit 120 having a positive feedback circuit including two transistors $M_1$ and $M_2$ whose gates and drains are connected, and a current source circuit 130 having a current source $I_1$.

Also, both terminals of the inductor $L_1$ and the variable capacitors $C_2$ and $C_3$ connected in series are connected to output nodes outp and outn, and the drains of the transistors $M_1$ and $M_2$ included in the amplifier circuit 120 are connected to the output nodes outp and outn respectively.

The LC VCO oscillates when an absolute value $|R_{in}|$ of an input impedance $R_{in}=-2/g_m$ of the positive feedback circuit constituting the amplifier circuit 120 is an equivalent resistance of the LC resonant circuit 110 or less. The oscillation frequency of an output signal can be expressed by Equation 1 below. Here, $C_T$ is a combined capacitance value of the capacitor $C_1$ and the variable capacitors $C_2$ and $C_3$.

$$f_{osc} = \frac{1}{2\pi\sqrt{L_1 \cdot C_T}} \quad \text{[Equation 1]}$$

As seen from Equation 1, the oscillation frequency of an output signal of the VCO varies according to the inductance value of the inductor $L_1$ included in the LC resonant circuit 110 or the combined capacitance value $C_T$. In general, a spiral inductor consisting of a spiral line and an outgoing line is used as the inductor $L_1$ and formed on the same substrate as the transistors $M_1$ and $M_2$. Here, the inductance value of the inductor $L_1$ varies differentially, and it is very difficult to control the oscillation frequency by adjusting the inductance value. Thus, a fixed value is used as the inductance value of the inductor $L_1$, and a method of adjusting the capacitance values of the variable capacitors $C_2$ and $C_3$ by applying a control signal vc to the variable capacitors $C_2$ and $C_3$ constituting the varactor device is widely used to control the oscillation frequency. Here, the variable range of the capacitance value of the varactor device corresponds to the variable range of the oscillation frequency.

Meanwhile, for operation of the VCO shown in FIG. 1, a voltage for driving the current source $I_1$ of the current source circuit 130 and a voltage for driving the positive feedback circuit included in the amplifier circuit 120 are required. In other words, the sum of the two voltages is required as the minimum power supply voltage for operation of the VCO of FIG. 1. Thus, the current source $I_1$ needs to be removed, so that the VCO can be driven even at a low power supply voltage.

Figure 2:
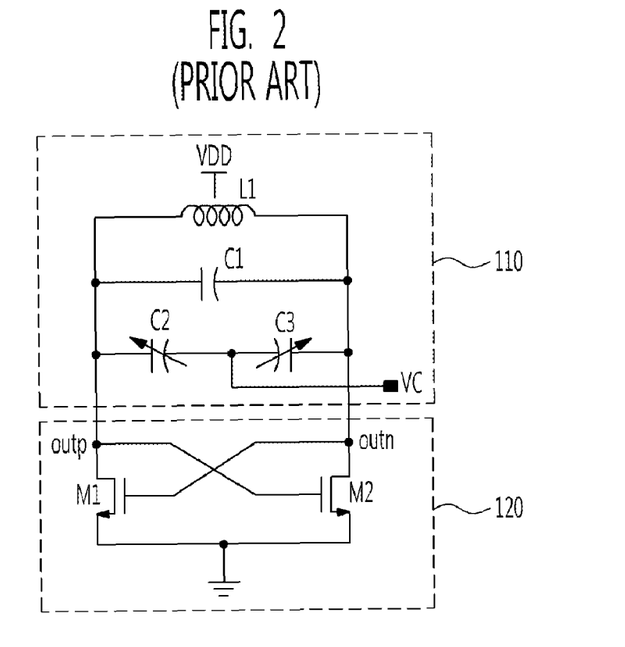

FIG. 2 shows the VCO of FIG. 1 from which the current source $I_1$ has been removed for this reason. Here, the gate-source voltage of the transistors $M_1$ and $M_2$ needs to be a threshold voltage or more, so that negative resistance can be obtained by positive feedback in the amplifier circuit 120. However, in the VCO of FIG. 2, a power supply voltage VDD corresponds to the gate-source voltage of the transistors $M_1$ and $M_2$, and thus needs to be the threshold value of the transistors $M_1$ and $M_2$ or more.

Also, the oscillation signals of the VCOs shown in FIGS. 1 and 2 are adjusted by a varactor device, which may restrict characteristics of the VCOs. Further, it is impossible to design the VCOs without a varactor device.

SUMMARY OF THE INVENTION

The present invention is directed to an LC voltage-controlled oscillator (VCO) capable of outputting an oscillation signal even when a power supply voltage is lower than a predetermined threshold voltage.

The present invention is also directed to enabling implementation of an LC VCO without a varactor device.

The present invention is also directed to minimizing 1/f noise of an LC VCO and improving overall phase noise.

One aspect of the present invention provides an LC VCO including: an LC resonant circuit including at least one inductor whose both terminals are connected to output nodes, and at least one capacitor connected in parallel with the inductor; and an amplifier circuit including at least one pair of switching transistors. Here, drains of the pair of switching transistors are connected to the output nodes respectively, and gates of the switching transistors are connected with the drains through a variable capacitance block exhibiting different characteristics according to an input signal.

The variable capacitance block may include: a control transistor having a gate node to which the input signal is applied; and a capacitor connected in parallel with a source and drain of the control transistor.

The variable capacitance block may further include a resistor added to the source or drain of the control transistor.

The control transistor may be an n-type or p-type transistor.

The LC VCO may further include a bias voltage supply circuit for supplying a constant bias voltage to the gates of the switching transistors.

The bias voltage supply circuit may include a bias voltage supply transistor. Here, a gate of the bias voltage supply transistor may be connected with a drain and with the gates of the pair of switching transistors through a resistor, and may also be connected with a source through a capacitor.

The bias voltage supply circuit may further include a current source for supplying current to the drain of the bias voltage supply transistor.

The at least one inductor may be connected to a power supply terminal, sources of the switching transistors may be connected to the ground, and the switching transistors may be n-type transistors.

The at least one inductor may be connected to the ground, sources of the switching transistors may be connected to a power supply terminal, and the switching transistors may be p-type transistors.

The LC VCO may further include a current source circuit having a current source connected to sources of the pair of switching transistors.

The LC resonant circuit may further include at least one varactor device connected in series with each other and in parallel with the at least one inductor, and exhibiting different characteristics according to an input signal.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

Throughout this specification, when an element is referred to as being "connected" or "coupled" to another element, it can be directly connected or coupled to the other element or electrically connected or coupled to the other element with yet another element interposed between them.

Throughout this specification, when an element is referred to as "comprises," "includes," or "has" a component, it does not preclude another component but may further include the other component unless the context clearly indicates otherwise. Also, as used herein, the terms "... unit," "... device," "... module," etc., denote a unit of processing at least one function or operation, and may be implemented as hardware, software, or combination of hardware and software.

First Exemplary Embodiment

Figure 3:
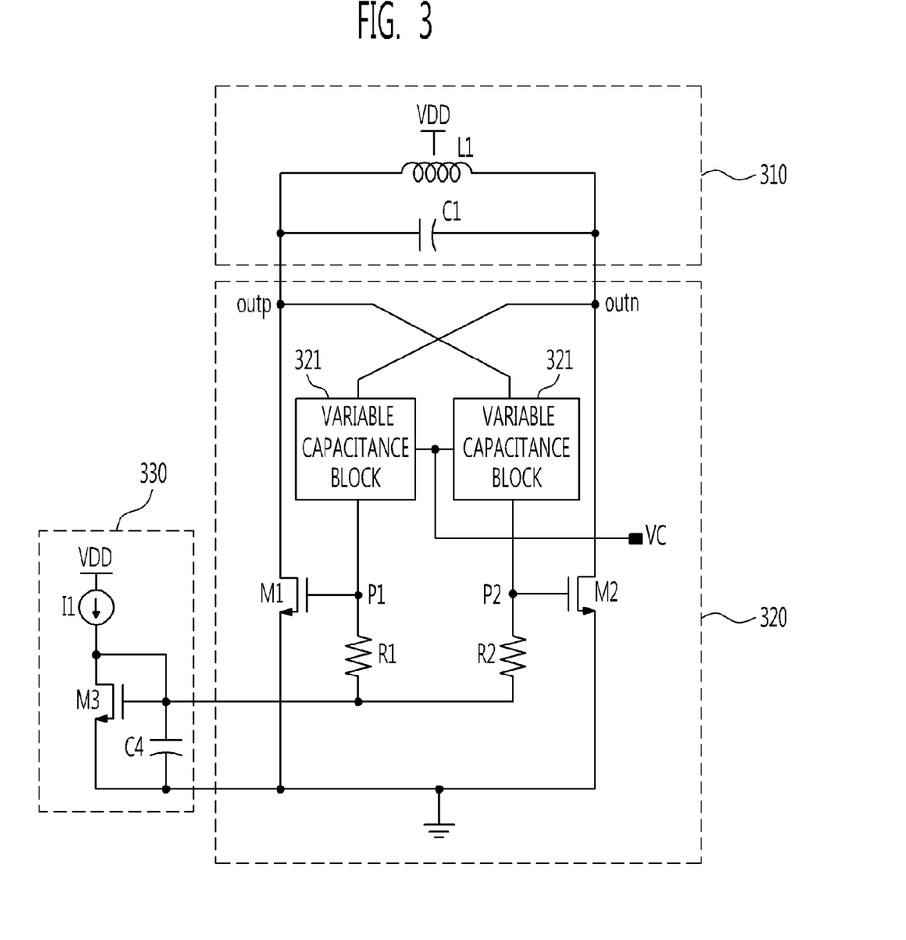
FIG. 3 is a circuit diagram of an LC VCO according to a first exemplary embodiment of the present invention.

FIG. 3 is a circuit diagram of an LC voltage-controlled oscillator (VCO) according to a first exemplary embodiment of the present invention.

As shown in FIG. 3, an LC VCO according to the first exemplary embodiment of the present invention may include an LC resonant circuit 310, an amplifier circuit 320, and a bias voltage supply circuit 330.

First, the LC resonant circuit 310 may include at least one inductor $L_1$ connected to a power supply terminal VDD, and a capacitor $C_1$ connected in parallel with the inductor $L_1$. Both terminals of the inductor $L_1$ and the capacitor $C_1$ are connected to output nodes outp and outn.

The amplifier circuit 320 may include one pair of transistors $M_1$ and $M_2$. The gate nodes of the transistors $M_1$ and $M_2$ are connected to a bias voltage through resistors $R_1$ and $R_2$ respectively, and also connected with the drain nodes of the transistors $M_2$ and $M_1$ through variable capacitance blocks 321 respectively. To be specific, the gate node of the transistor $M_1$ is connected to the drain node of the transistor $M_2$ through the variable capacitance block 321, and the gate node of the transistor $M_2$ is connected to the drain node of the transistor $M_1$ through the variable capacitance block 321. The drain nodes of the transistors $M_1$ and $M_2$ are connected to the output nodes outp and outn respectively, and the source nodes are connected to the ground. Although the amplifier circuit 320 includes the one pair of transistors $M_1$ and $M_2$ in FIG. 3, two or more pairs of transistors may be included. A control voltage VC is applied to the variable capacitance blocks 321, thereby adjusting the impedance of the variable capacitance blocks 321, which will be described later in detail.

Meanwhile, the bias voltage supply circuit 330 may include a current source $I_1$ and a transistor $M_3$ whose drain node and gate node are formed as a common node and connected with the gate nodes of the transistors $M_1$ and $M_2$ respectively through the resistors $R_1$ and $R_2$, and whose gate node is connected with the source node through a capacitor $C_4$. In the bias voltage supply circuit 330, the gate of the transistor $M_3$ has a constant direct current (DC) voltage value due to the current source $I_1$. Although the bias voltage supply circuit 330 includes the current source $I_1$ and the transistor $M_3$ in FIG. 3, the constitution is not limited to this. A bias voltage supply circuit for applying a constant DC voltage to the gate nodes of the transistors $M_1$ and $M_2$ can be modified into various forms according to the necessity of those of ordinary skill in the art.

The variable capacitance blocks 321 included in the amplifier circuit 320 can be implemented in various forms, and examples are shown in FIGS. 4A to 4D.

As shown in FIGS. 4A to 4D, the variable capacitance blocks 321 may basically include a transistor $M_4$ having a gate node to which the control voltage VC is applied, and a capacitor $C_5$ connected between the drain node and source node of the transistor $M_4$. This is merely an example, and any circuits that are implemented by another lumped element or a different type of device and exhibit different electrical characteristics according to the applied control voltage VC can be used as the variable capacitance blocks 321.

Figure 4A:
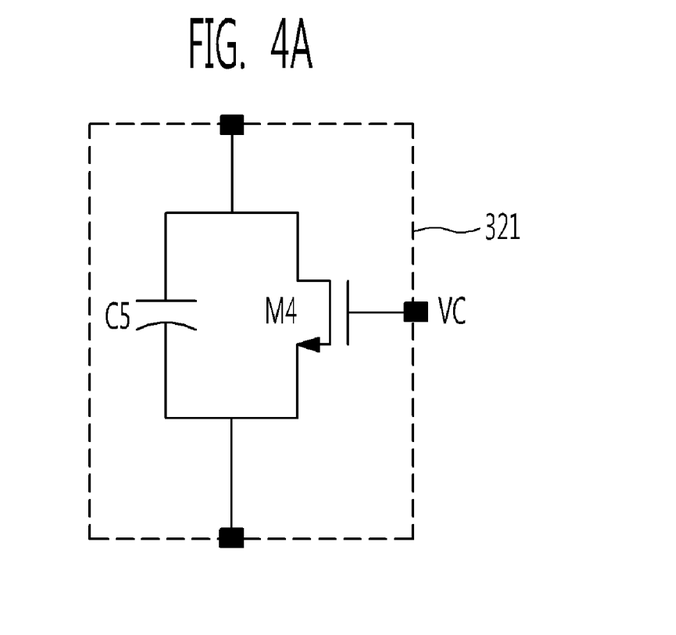
FIGS. 4A to 4D are circuit diagrams of a variable capacitance block according to an exemplary embodiment of the present invention.
Figure 4B:
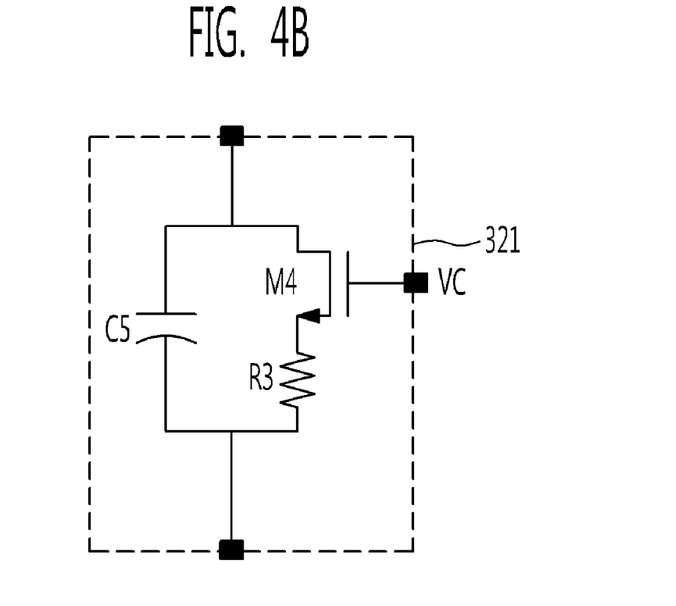

For example, as shown in FIG. 4A, the variable capacitance blocks 321 may include the n-type transistor $M_4$ and the capacitor $C_5$ connected between the drain node and source node of the n-type transistor $M_4$, or as shown in FIG. 4B, the source node of the n-type transistor $M_4$ may be connected with one end of the capacitor $C_5$ through at least one resistor $R_3$.

Figure 4C:
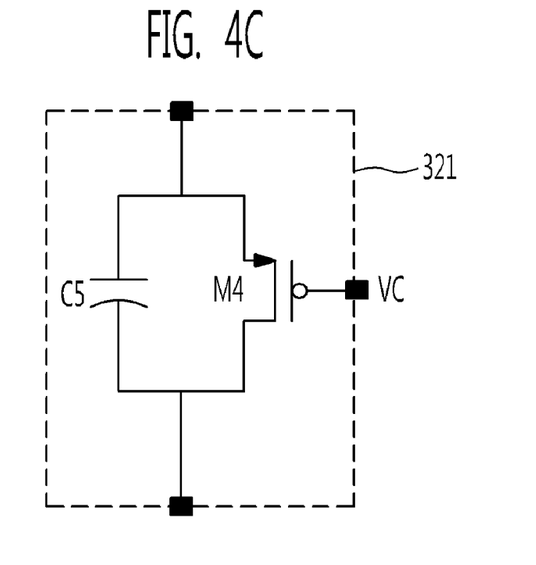
Figure 4D:
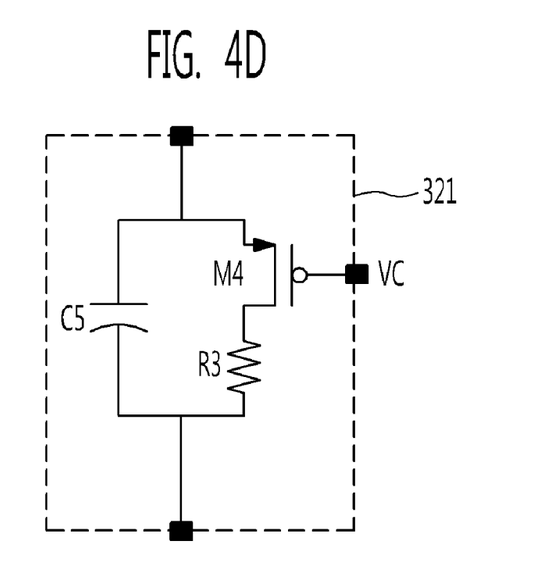

Meanwhile, as shown in FIGS. 4C and 4D, the n-type transistor $M_4$ may be replaced by the p-type transistor $M_4$ in the variable capacitance blocks 321 shown in FIGS. 4A and 4B. In this specification, the variable capacitance blocks 321 having the constitution shown in FIG. 4A, 4B, 4C or 4D are described as an example, but any circuits whose impedance can vary according to a factor such as the control voltage VC can be the variable capacitance blocks 321.

The oscillation frequency of the output signal of an LC VCO according to an exemplary embodiment of the present invention can be expressed by Equation 2 below. Here, a case in which the variable capacitance blocks 321 are implemented by the circuit shown in FIG. 4C will be described as an example.

$$f_{osc} = \frac{1}{2\pi\sqrt{L_1 \cdot C_T}}$$ [Equation 2]

Here, $C_T$ is determined according to a capacitance value of the overall circuit that can vary according to a specific control voltage condition. $C_T$ can be expressed by Equation 3 below.

$$C_T = C_1 + \frac{C_{gm}}{2}$$ [Equation 3]

Figure 5:
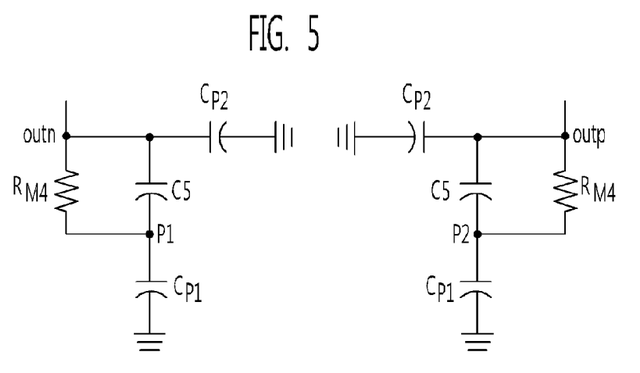
FIG. 5 is an equivalent circuit diagram illustrating characteristics of a variable capacitance block according to an exemplary embodiment of the present invention.

Here, $C_{gm}$ is calculated according to a process described below, and an equivalent circuit for describing characteristics of variable capacitance elements included in the amplifier circuit 320 is shown in FIG. 5 to calculate $C_{gm}$.

In the equivalent circuit of FIG. 5, $C_{P1}$ and $C_{P2}$ denote parasitic capacitances at a node P1 or P2 and the output node outn or outp respectively, and $R_{M4}$ denotes the channel resistance of the transistor $M_4$ or the resistance in its off-state.

From a half circuit on the left side of FIG. 5, $C_{gm}$ can be calculated. An admittance seen from the output node outn can be expressed by Equation 4 below.

[Equation 4]

$$Y_{gm} = \frac{sC_{P1} + s^2 C_5 C_{P1} R_{M4}}{1 + s(C_5 + C_{P1})} + sC_{P2}$$

When $R_{M4}$ approaches 0 in Equation 4, $Y_{gm}$ becomes $sC_{P1}+sC_{P2}$, and $C_{gm}=C_{P1}+C_{P2}$. Meanwhile, when $R_{M4}$ approaches infinity, $Y_{gm}$ becomes $sC_{P1} C_5/(C_{P1}+C_5)+sC_{P2}$, and $C_{gm}=C_{P1}C_5/(C_{P1}+C_5)+C_{P2}$.

$R_{M4}$ approaches 0 when the control voltage VC is 0 V, and approaches infinity when the control voltage VC is a power supply voltage. When the control voltage VC is between 0 V and the power supply voltage, $C_{gm}$ varies according to the control voltage VC.

Figure 6:
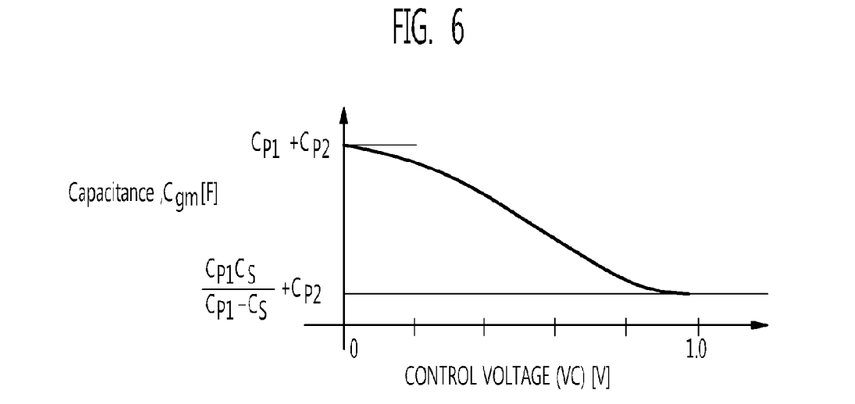
FIG. 6 is a graph of capacitance versus control voltage in an LC VCO according to an exemplary embodiment of the present invention.

FIG. 6 is a graph showing the change in $C_{gm}$ according to the control voltage VC. Here, it is assumed that the control voltage VC varies between 0 V and 1.0 V. As the control voltage VC varies, $C_{P1}$ and $C_{P2}$ also vary. In this case also, the graph of FIG. 6 can be maintained in the form of a monotonically decreasing function dependent on the control voltage VC. As $C_{gm}$ varies according to the control voltage VC, $C_T$ varies, and the oscillation frequency can be adjusted. In other words, the transistor $M_4$ included in the variable capacitance blocks 321 is turned on or off according to the control voltage VC input to the gate node of the transistor $M_4$ and operates also in the intermediate region so that the oscillation frequency of the LC VCO can be adjusted to a desired value.

Figure 7:
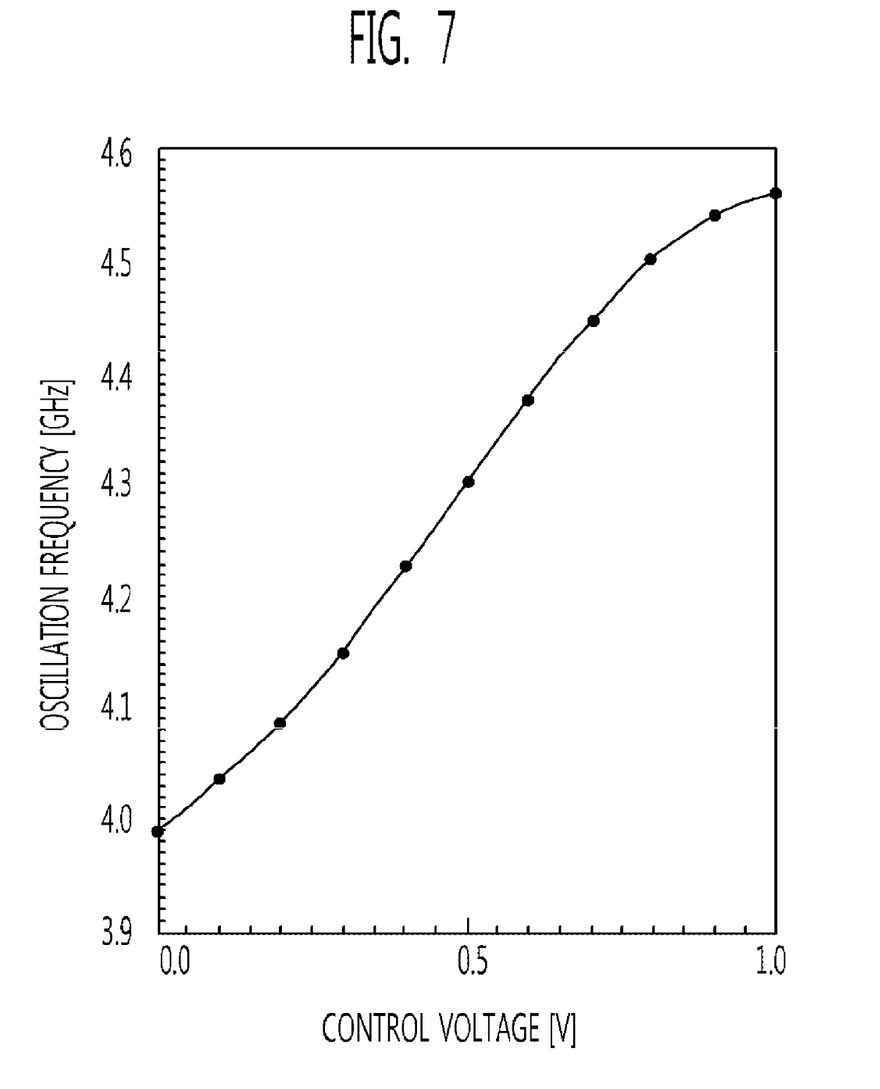
FIG. 7 is a graph of oscillation frequency versus control voltage applied to an LC VCO according to an exemplary embodiment of the present invention.

FIG. 7 is a graph showing oscillation frequency according to the control voltage VC as an operation characteristic of the LC VCO shown in FIG. 3. Here, it is assumed that the power supply voltage is 0.5 V, and the control voltage VC varies between 0 V and 1.0 V. To obtain the graph of FIG. 7, the LC VCO of FIG. 3 is implemented using complementary metal oxide semiconductor (CMOS) models of Taiwan Semiconductor Manufacturing Company, Limited (TSMC).

Referring to FIG. 7, it can be seen that the oscillation frequency varies according to the control voltage VC applied to the variable capacitance blocks 321. Thus, it is possible to obtain an output signal having a desired oscillation frequency by appropriately adjusting the control voltage VC applied to the variable capacitance blocks 321 without using a varactor device.

Meanwhile, the oscillation signal amplitude $V_{OSC}$ of the LC VCO in an oscillation state can be expressed by Equation 5 below.

$$V_{OSC}=Z_{total}\times I_1$$ [Equation 5]

Here, $Z_{total}=(1/g_m)//Z_{tank}$, $1/g_m$ is a negative resistance according to a positive feedback of the circuit, and $Z_{tank}$ is an impedance value of the LC resonant circuit 310. Meanwhile, $g_m$ and $I_1$ have a relationship expressed by Equation 6 below.

$$g_m=-\sqrt{2k\beta I_1}$$ [Equation 6]

Here, $\beta$ is a value dependent on a transistor characteristic, and k denotes a ratio of width/length of the transistors $M_1$ and $M_2$ included in the amplifier circuit 320 to width/length of the transistor $M_3$ included in the bias voltage supply circuit 330.

Within a control voltage range, a negative resistance characteristic can be obtained by the positive feedback, and thus oscillation according to Equation 5 can be maintained.

Meanwhile, the gate-source voltage of the transistors $M_1$ and $M_2$ included in the amplifier circuit 320 is determined by the bias voltage supply circuit 330. To be specific, the gate node of the transistor $M_3$ in the bias voltage supply circuit 330 has the constant DC voltage value due to the current source $I_1$, and is connected to the gate nodes of the transistors $M_1$ and $M_2$ through the resistors R1 and R2. For this reason, it is possible to say that the electric potential of the gate nodes of the transistors $M_1$ and $M_2$ is determined by the bias voltage supply circuit 330. Thus, by appropriately controlling a bias voltage provided by the bias voltage supply circuit 330, the gate-source voltage of the transistors $M_1$ and $M_2$ included in the amplifier circuit 320 can be adjusted. To have negative resistance for oscillation in the amplifier circuit 320, the gate-source voltage of the transistors $M_1$ and $M_2$ needs to be a threshold voltage or more. Since the gate-source voltage of the transistors $M_1$ and $M_2$ is determined by the bias voltage supply circuit 330, oscillation can be maintained even when the power supply voltage VDD is set to be lower than a value used in a conventional LC VCO. Furthermore, as long as the minimum current required by the transistors $M_1$ and $M_2$ for oscillation is guaranteed, oscillation is enabled even when the power supply voltage VDD is lower than the threshold voltage.

In other words, in the LC VCO shown in FIG. 2, the power supply voltage VDD corresponds to the gate-source voltage of the transistors $M_1$ and $M_2$, and thus needs to be the threshold voltage of the transistors $M_1$ and $M_2$ or more. On the other hand, in the LC VCO according to an exemplary embodiment of the present invention, the gate-source voltage of the transistors $M_1$ and $M_2$ is irrelevant to the power supply voltage VDD, and thus oscillation is enabled even when the power supply voltage VDD is lower than the threshold voltage of the transistors $M_1$ and $M_2$. However, the minimum current for oscillation needs to be guaranteed because current flowing through the circuit varies according to the drain-source voltage of the transistors $M_1$ and $M_2$.

Meanwhile, the index of phase noise $L(\Delta f)$ of the LC VCO can be expressed by Equation 7 below.

$$L(\Delta f) = 20 \log\left(\frac{P_{sig}(f_o)}{P_{noise}(\Delta f)}\right)$$ [Equation 7]

Here, $P_{sig}(f_o)$ is the power value of the oscillation frequency, and $P_{noise}(\Delta f)$ is a power value at a position spaced apart from the oscillation frequency by a specific offset frequency. In other words, the phase noise index is defined as a difference between $P_{sig}(f_o)$ and $P_{noise}(\Delta f)$ and phase noise performance can be improved by increasing the signal level of the oscillation frequency or reducing the power value at the specific offset frequency. One factor increasing the power value $P_{noise}(\Delta f)$ at the specific offset frequency is flicker noise of a current source, that is, 1/f noise. The flicker noise approaches the oscillation frequency due to an up-conversion mechanism, and thus the phase noise deteriorates. In the VCO shown in FIG. 1, the current source circuit 130 is included between the amplifier circuit 120 and the ground, and thus large 1/f noise occurs. On the other hand, in the VCO of FIG. 3, the one pair of transistors $M_1$ and $M_2$ instead of the current source circuit 130 is included and operates as an amplifier as well as a current source so that 1/f noise can be improved. Thus, the power value $P_{noise}(\Delta f)$ is reduced, and overall phase noise can be improved.

Second Exemplary Embodiment

Figure 8:
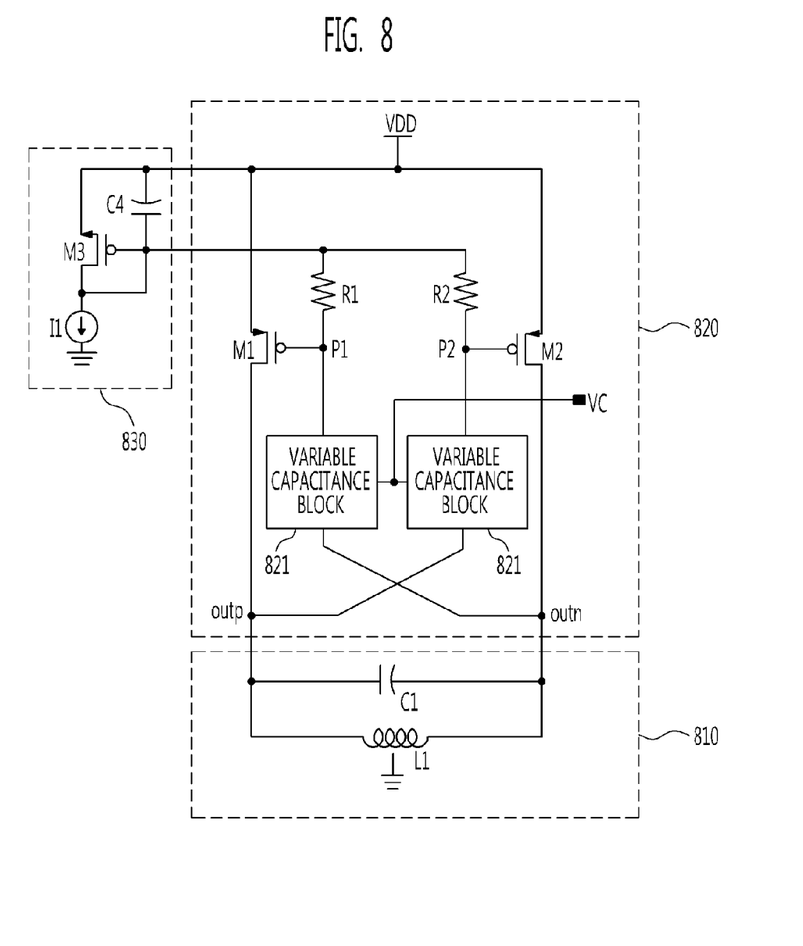
FIG. 8 is a circuit diagram of an LC VCO according to a second exemplary embodiment of the present invention.

FIG. 8 is a circuit diagram of an LC VCO according to a second exemplary embodiment of the present invention.

Referring to FIG. 8, in an LC VCO according to the second exemplary embodiment of the present invention, all the n-type transistors included in the LC VCO according to the first exemplary embodiment of the present invention shown in FIG. 3 are replaced by p-type transistors, and the positions of the power supply terminal VDD and the ground terminal are changed with each other.

The constitution of the LC VCO according to the second exemplary embodiment of the present invention will be described in detail. The LC VCO according to the second exemplary embodiment of the present invention also includes an LC resonant circuit 810, an amplifier circuit 820, and a bias voltage supply circuit 830.

First, the LC resonant circuit 810 has the same constitution as the LC resonant circuit 310 of the LC VCO shown in FIG. 3 except that at least one inductor $L_1$ is connected to the ground instead of the power supply terminal VDD.

Also, the amplifier circuit 820 has the same constitution as the amplifier circuit 320 of the LC VCO shown in FIG. 3 except that one pair of transistors $M_1$ and $M_2$ consists of p-type transistors and the source terminals of the transistors $M_1$ and $M_2$ are connected to the power supply terminal VDD. Here, variable capacitance blocks 821 may also be the circuit shown in FIG. 4A, 4B, 4C or 4D or another circuit exhibiting different characteristics according to the control voltage VC.

Meanwhile, the bias voltage supply circuit 830 has the same constitution as the bias voltage supply circuit 330 of the LC VCO shown in FIG. 3 except that a transistor $M_3$ included in the bias voltage supply circuit 830 is a p-type transistor and the source node of the transistor $M_3$ is connected to the power supply terminal VDD.

By controlling the control voltage VC applied to the variable capacitance blocks 821, the LC VCO of FIG. 8 can also adjust the oscillation frequency or amplitude of an output signal to a desired value.

Third Exemplary Embodiment

Figure 9:
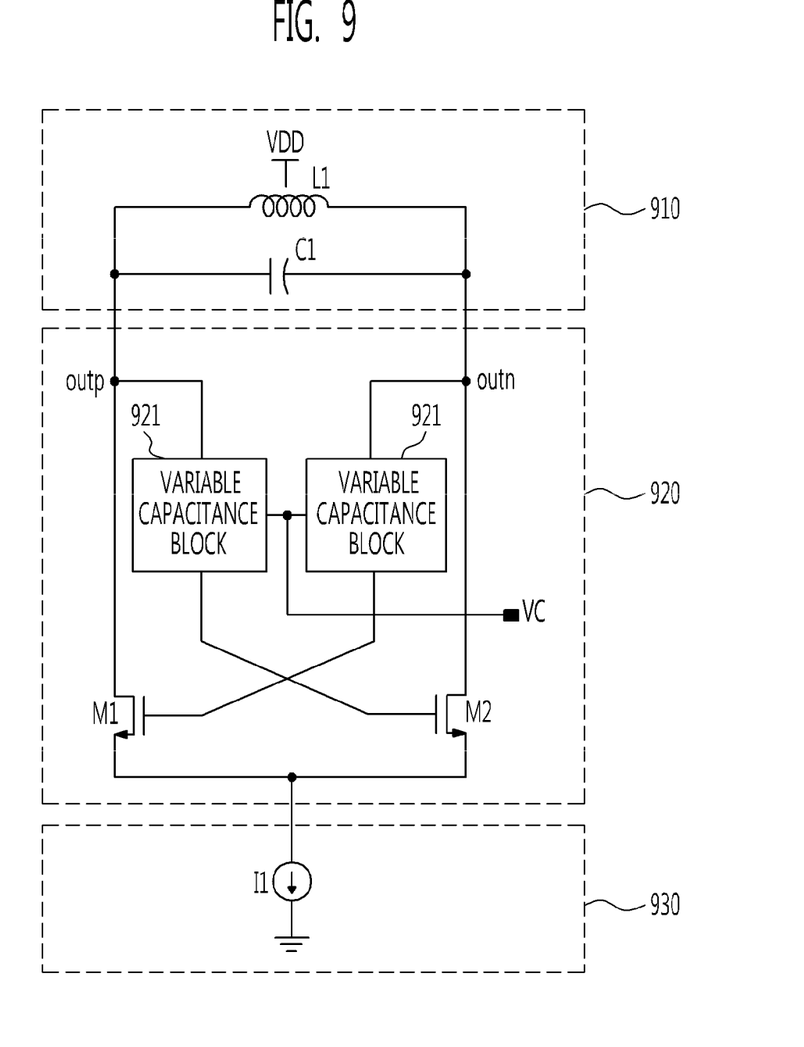
FIG. 9 is a circuit diagram of an LC VCO according to a third exemplary embodiment of the present invention.

FIG. 9 is a circuit diagram of an LC VCO according to a third exemplary embodiment of the present invention.

An LC VCO shown in FIG. 9 is improved from the conventional LC VCO shown in FIG. 1.

Referring to FIG. 9, the LC VCO according to the third exemplary embodiment of the present invention may include an LC resonant circuit 910, an amplifier circuit 920, and a current source circuit 930.

First, the LC resonant circuit 910 may include at least one inductor $L_1$ connected to a power supply terminal VDD, and at least one capacitor $C_1$ connected in parallel with the inductor $L_1$.

Also, the amplifier circuit 920 may include at least one pair of transistors $M_1$ and $M_2$, and the gate nodes of the transistors $M_1$ and $M_2$ are connected to the drain nodes of the transistors $M_2$ and $M_1$ through variable capacitance blocks 921 respectively. To be specific, the gate node of the transistor $M_1$ is connected to the drain node of the transistor $M_2$ through the variable capacitance block 921, and the gate node of the transistor $M_2$ is connected to the drain node of the transistor $M_1$ through the variable capacitance block 921. The variable capacitance blocks 921 may also be the circuit shown in FIG. 4A, 4B, 4C or 4D or another circuit exhibiting different characteristics according to the control voltage VC.

Meanwhile, the current source circuit 930 including a current source $I_1$ is prepared between the amplifier circuit 920 and the ground. In other words, the current source $I_1$ included in the current source circuit 930 is disposed between the sources of the transistors $M_1$ and $M_2$ and the ground.

Fourth Exemplary Embodiment

Figure 10:
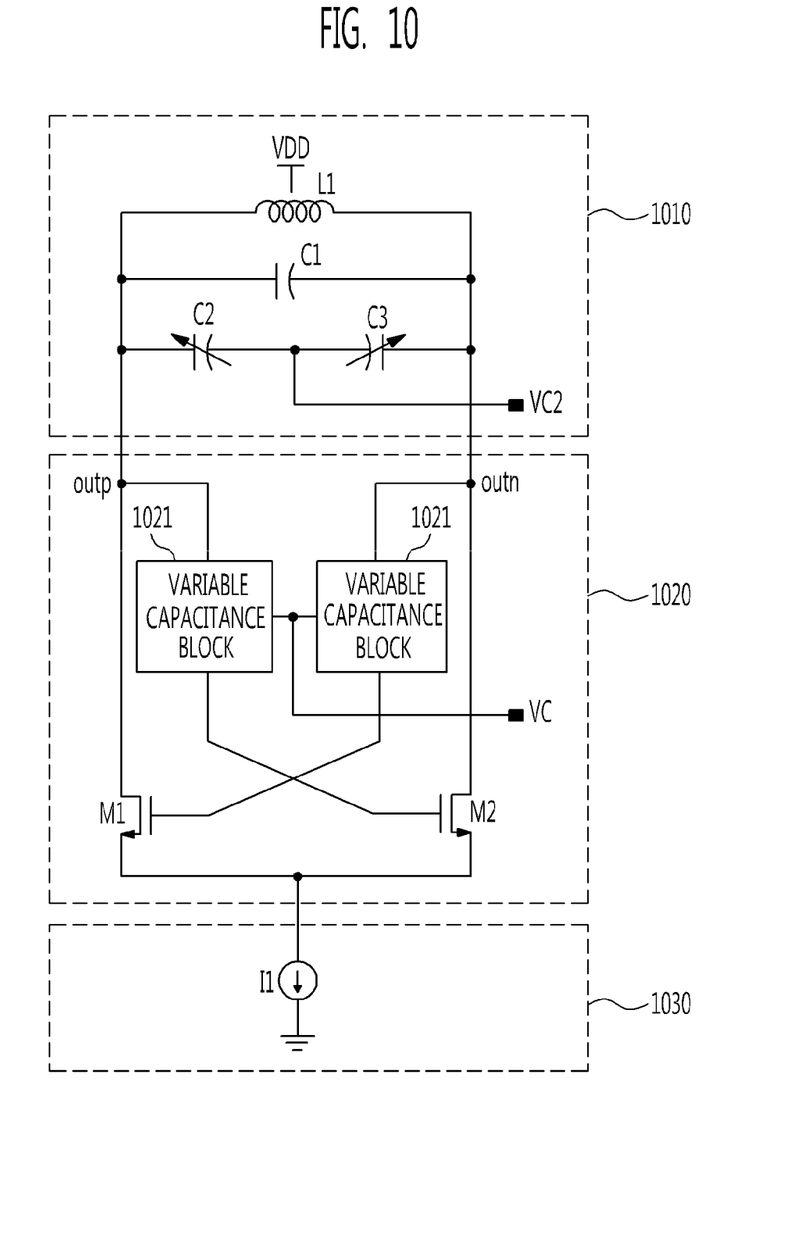
FIG. 10 is a circuit diagram of an LC VCO according to a fourth exemplary embodiment of the present invention.

FIG. 10 is a circuit diagram of an LC VCO according to a fourth exemplary embodiment of the present invention.

An LC VCO shown in FIG. 10 has the constitution of the LC VCO shown in FIG. 9 in which a varactor device is additionally included.

Referring to FIG. 10, the LC VCO according to the fourth exemplary embodiment of the present invention may also include an LC resonant circuit 1010, an amplifier circuit 1020, and a current source circuit 1030. The LC resonant circuit 1010 may include at least one inductor $L_1$ connected with a power supply terminal VDD, and at least one capacitor $C_1$ connected in parallel with the inductor $L_1$, and at least one varactor device connected in series with each other and connected in parallel with the inductor $L_1$ and the capacitor $C_1$. In FIG. 10, the varactor device is expressed by variable capacitors $C_2$ and $C_3$ as an equivalent. Since the LC VCO of FIG. 10 has the same constitution as the LC VCO of FIG. 9 except for the LC resonant circuit 1010, the amplifier circuit 1020 and the current source circuit 1030 will not be described again.

In the LC VCO of FIG. 10, control voltages VC and VC2 are applied to the varactor devices $C_2$ and $C_3$ included in the LC resonant circuit 1010 and variable capacitance blocks 1021 included in the amplifier circuit 1020. In other words, by applying the control voltages VC and VC2, it is possible to change the capacitance value of the variable capacitors $C_2$ and $C_3$ included in the varactor device as well as the capacitance value of the variable capacitance blocks 1021, and thus the variable range of the oscillation frequency is further widened.

Thus far, only the LC VCOs shown in FIGS. 2, 8, 9 and 10 have been described as examples, but an LC VCO can be implemented in various modified forms. For example, n-type transistors included in the LC VCOs shown in FIGS. 9 and 10 can be replaced by p-type transistors, and also at least one varactor device can be included in the LC VCOs of FIGS. 2 and 8 as shown in FIG. 10.

As described above, since the gate-source voltage of a transistor included in an LC VCO according to an exemplary embodiment of the present invention is determined regardless of a power supply voltage value, the power supply voltage value for oscillation is not restricted, and the LC VCO can normally operate even when a power supply voltage lower than a threshold voltage of the transistor is applied.

Also, in an exemplary embodiment of the present invention, a varactor device is replaced by a variable capacitance block including a transistor and a capacitor, so that an LC VCO can be implemented even without a varactor device.

Further, since a current source which causes 1/f noise is removed from an LC VCO according to an exemplary embodiment of the present invention, 1/f noise is minimized, and overall phase noise can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An LC voltage-controlled oscillator (VCO), comprising:
    an LC resonant circuit including at least one inductor having both terminals coupled to output nodes, and at least one capacitor coupled in parallel with the inductor;
    an amplifier circuit including at least one pair of switching transistors and at least one pair of variable capacitance blocks exhibiting different characteristics according to an input signal; and
    a bias voltage supply circuit configured to supply a constant bias voltage to gates of the switching transistors,
    wherein drains of the pair of switching transistors are coupled to the output nodes, respectively, and a gate of one of the switching transistors is coupled to the drain of the other one of the switching transistors through a corresponding one of the variable capacitance blocks.

2. The LC VCO of claim 1, wherein each of the variable capacitance blocks includes:
    a control transistor having a gate node to which the input signal is applied; and
    a capacitor coupled to and disposed between a source and a drain of the control transistor.

3. The LC VCO of claim 2, wherein the control transistor is an n-type or p-type transistor.

4. The LC VCO of claim 2, wherein each of the variable capacitance blocks further include a resistor coupled to the source or drain of the control transistor.

5. The LC VCO of claim 4, wherein the control transistor is an n-type or p-type transistor.

6. The LC VCO of claim 1, wherein the bias voltage supply circuit includes a bias voltage supply transistor, and
    wherein a gate of the bias voltage supply transistor is coupled to a drain thereof and to the gates of the pair of switching transistors through resistors, and is also coupled to a source thereof through a capacitor.

7. The LC VCO of claim 6, wherein the bias voltage supply circuit further includes a current source configured to supply a current to the drain of the bias voltage supply transistor.

8. The LC VCO of claim 1, wherein the at least one inductor is coupled to a power supply terminal,
    wherein sources of the switching transistors are coupled to the ground, and
    wherein the switching transistors are n-type transistors.

9. The LC VCO of claim 1, wherein the at least one inductor is coupled to the ground,
    wherein sources of the switching transistors are coupled to a power supply terminal, and
    wherein the switching transistors are p-type transistors.

* * * * *